United States Patent
Kim

(10) Patent No.: US 10,992,148 B2
(45) Date of Patent: Apr. 27, 2021

(54) PRECHARGE RESISTOR PROTECTION APPARATUS

(71) Applicant: LG Chem, Ltd., Seoul (KR)

(72) Inventor: Soo-Kwon Kim, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/623,982

(22) PCT Filed: Jan. 30, 2019

(86) PCT No.: PCT/KR2019/001310
§ 371 (c)(1),
(2) Date: Dec. 18, 2019

(87) PCT Pub. No.: WO2019/151779
PCT Pub. Date: Aug. 8, 2019

(65) Prior Publication Data
US 2020/0144832 A1    May 7, 2020

(30) Foreign Application Priority Data
Jan. 30, 2018  (KR) .......................... 10-2018-0011458

(51) Int. Cl.
*H02H 7/00*    (2006.01)
*H02J 7/00*    (2006.01)
(Continued)

(52) U.S. Cl.
CPC .......... *H02J 7/0031* (2013.01); *G01R 31/382* (2019.01); *H02H 1/0007* (2013.01); *H02H 7/18* (2013.01)

(58) Field of Classification Search
None
See application file for complete search history.

(56) References Cited

U.S. PATENT DOCUMENTS 7,368,829 B2 *  5/2008  Tezuka ................ H01H 47/002
                                                  307/9.1
8,174,240 B2 *  5/2012  Yun ...................... G01R 31/389
                                                  320/132
(Continued)

FOREIGN PATENT DOCUMENTS

CN        106427619 A      2/2017
JP        2006304408 A    11/2006
(Continued)

OTHER PUBLICATIONS

International Search Report from Application No. PCT/KR2019/001310 dated May 17, 2019, 2 pages.
(Continued)

*Primary Examiner* — Stephen W Jackson
(74) *Attorney, Agent, or Firm* — Lerner, David, Littenberg, Krumholz & Mentlik, LLP

(57) ABSTRACT

A precharge resistor protection apparatus including a sensing unit configured to measure a battery voltage applied to both ends of a battery cell included in the battery pack and a precharge current flowing in the precharge resistor, and a processor operably coupled to the sensing unit. The processor calculates a first power estimated as being supplied to the precharge resistor and a second power supplied to the precharge resistor during a driving time of the precharge circuit unit by using at least one of a capacitance of a capacitor connected to both ends of the battery pack, the battery voltage and the precharge current, compares a reference power range according to the first power with the second power, and controls an operation state of the precharge relay based on the comparison result.

10 Claims, 5 Drawing Sheets

(51) Int. Cl.
*G01R 31/382* (2019.01)
*H02H 1/00* (2006.01)
*H02H 7/18* (2006.01)

(56) References Cited

U.S. PATENT DOCUMENTS

| | | | |
|---|---|---|---|
| 9,840,137 B2* | 12/2017 | Kusumi | B60K 6/28 |
| 2010/0277845 A1 | 11/2010 | Park et al. | |
| 2013/0214705 A1 | 8/2013 | Steck et al. | |
| 2014/0028088 A1 | 1/2014 | Salziger et al. | |
| 2015/0061376 A1 | 3/2015 | Hartl et al. | |
| 2015/0219720 A1 | 8/2015 | Huh | |
| 2015/0372517 A1 | 12/2015 | Lee | |
| 2017/0003353 A1 | 1/2017 | Seo | |
| 2017/0322248 A1 | 11/2017 | Miret et al. | |
| 2019/0229521 A1* | 7/2019 | Roberts | H02H 7/1222 |

FOREIGN PATENT DOCUMENTS

| | | |
|---|---|---|
| JP | 200844451 A | 2/2008 |
| JP | 200989535 A | 4/2009 |
| JP | 4668138 B2 | 4/2011 |
| KR | 20090075910 A | 7/2009 |
| KR | 20140025627 A | 3/2014 |
| KR | 20140042540 A | 4/2014 |
| KR | 20160007837 A | 1/2016 |
| KR | 101641762 B1 | 7/2016 |
| KR | 20160137493 A | 11/2016 |
| KR | 20170004499 A | 1/2017 |

OTHER PUBLICATIONS

Extended European Search Report for EP19748394.4 dated Jan. 15, 2021; 5 pages.

* cited by examiner

PRECHARGE RESISTOR PROTECTION APPARATUS

CROSS-REFERENCE TO RELATED APPLICATIONS

This application is a national phase entry under 35 U.S.C. § 371 of International Application No. PCT/KR2019/001310, filed Jan. 30, 2019, which claims priority to Korean Patent Application No. 10-2018-0011458, filed Jan. 30, 2018 the disclosures of which are incorporated herein by reference.

TECHNICAL FIELD

The present disclosure relates to a precharge resistor protection apparatus, and more particularly, to a precharge resistor protection apparatus capable of diagnosing a precharge circuit unit by comparing an estimated power that is estimated as being supplied to the precharge circuit unit with a reference power range.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance secondary batteries allowing repeated charging and discharging are being actively studied.

Secondary batteries commercially available at the present include nickel-cadmium batteries, nickel hydrogen batteries, nickel-zinc batteries, lithium secondary batteries and the like. Among them, the lithium secondary batteries are in the limelight since they have almost no memory effect compared to nickel-based secondary batteries and also have very low self-discharging rate and high energy density.

Meanwhile, the secondary battery may be used as a single secondary battery, but in many cases, a plurality of secondary batteries are connected in series and/or in parallel in order to provide a high-voltage and/or large-capacity power storage system. Also, the secondary battery may be used in the form of a battery pack, which includes a battery management device for controlling the charge and discharge operation of the secondary battery therein as a whole.

A battery pack management device used in the battery pack monitors the state of the battery by using a temperature sensor, a current sensor, a voltage sensor or the like and uses the monitoring result to estimate SOC and SOH, balance the voltage between battery cells or protect the battery from high voltage, overcurrent, low temperature and high temperature.

In particular, the battery pack management device may include a protection circuit to prevent overcurrent from flowing inside the battery pack. For example, the battery pack management device includes a fuse on the charge and discharge path of the battery pack, and when overcurrent occurs, the battery pack management device cuts the fuse by melting to prevent overcurrent from flowing into the charge and discharge path of the battery pack.

In addition, the battery pack management device may include a protection circuit for preventing a rush current, which is an overcurrent that may occur at the beginning of battery operation. Here, the rush current is an overcurrent that may occur instantaneously at the beginning of battery operation, and a precharge resistor is frequently used to protect the battery pack from the rush current.

FIG. 1 is a diagram schematically showing a conventional battery pack including a precharge circuit unit having a precharge resistor and a precharge relay. Referring to FIG. 1, the battery pack includes a precharge circuit unit having a precharge resistor 20 and a precharge relay 40, a battery cell 10, and a main relay 30. Here, the precharge resistor 20 is connected in parallel to a charge and discharge path of the battery pack, the precharge relay 40 is connected in series to the precharge resistor 20, and the main relay 30 is provided on the charge and discharge path of the battery pack. The precharge relay 40 and the main relay 30 are switched to each other to prevent the occurrence of rush current.

In particular, at the beginning of battery operation, the main relay 30 is not turned on from the first, but the precharge relay 40 is turned on first in a state where the main relay 30 is turned off. In addition, the main relay 30 is turned on after a predetermined time from when the precharge relay 40 is turned on, so that the charge and discharge path may be connected to the main relay 30. In this case, since a current flows via the precharge resistor 20, rush current does not occur, and an arc is not generated when the main relay 30 turns on.

As described above, overcurrent that may occur at the beginning of battery operation flows in the precharge resistor 20 frequently. Here, if the overcurrent flows in the precharge resistor 20 for a long time, the precharge resistor 20 is overheated, which may damage not only the precharge circuit unit but also the entire battery pack.

SUMMARY

Technical Problem

The present disclosure is designed to solve the problems of the related art, and therefore the present disclosure is directed to providing a precharge resistor protection apparatus, which may protect a precharge resistor when a power over an allowable power level is supplied to the precharge resistor by comparing a reference power according to a first power estimated as being supplied to the precharge resistor with a second power actually supplied to the precharge resistor and controlling the operation state of the precharge relay based on the comparison result.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a precharge resistor protection apparatus configured to protect a precharge resistor that is connected in series to a precharge relay of a precharge circuit unit, wherein the precharge resistor apparatus is configured to be connected in parallel to a main relay provided to a charge and discharge path of a battery pack. The precharge resistor protection apparatus includes: one or more sensors configured to measure a battery voltage applied to both ends of a battery cell included in the battery pack and a precharge current flowing in the precharge resistor; and a processor operably coupled to the one or more sensors.

Preferably, the processor may be configured to calculate a first power estimated as being supplied to the precharge resistor and a second power supplied to the precharge resistor during a driving time of the precharge circuit unit based on at least one of a capacitance of a capacitor connected to both ends of the battery pack, the battery voltage and the precharge current, compare a reference power range based on the first power with the second power, and control an operation state of the precharge relay based on a result of the comparison.

Preferably, the processor may be configured to calculate the first power according to the following equation:

$$W1 = \int_{T1}^{T2} Vb(T1) \times \left( \left( \frac{Vb(T1)}{R} \right) \times e^{-\left(\frac{t}{RC}\right)} \right) dt$$

wherein W1 is the first power, T1 is a start point of the driving time, T2 is an end point of the driving time, Vb(T1) is the battery voltage measured at the start point of the driving time, R is a resistance of the precharge resistor, and C is the capacitance of the capacitor.

Preferably, the processor may be configured to calculate the driving time as a time difference between a first time point at which a turn-on control signal for controlling the operation state of the precharge relay to a turn-on state is output and a second time point at which a turn-off control signal for controlling the operation state of the precharge relay to a turn-off state is output.

Preferably, the processor may be configured to calculate the second power supplied to the precharge resistor during the driving time based on the precharge current and the battery voltage.

Preferably, the processor may be configured to calculate the second power according to the following equation:

$$W2 = \int_{T1}^{T2} Vb(t) \times Ir(t) dt$$

wherein W2 is the second power, T1 is a start point of the driving time, T2 is an end point of the driving time, Vb(t) is the battery voltage, and Ir(t) is the precharge current.

Preferably, the processor may be configured to set a first reference power range, and set a second reference power range lower than the first reference power range based on the first power.

Preferably, the processor may be configured to determine that a circuit connected to the capacitor is shorted, when the second power is within the first reference power range based on the result of the comparison.

Preferably, the processor may be configured to determine that both ends of the battery pack are opened, when the second power is within the second reference power range based on the result of the comparison.

Preferably, the processor may be configured to control at least one of the operation state of the precharge relay or an operation state of the main relay to a turn-off state, when the second power is within the first reference power range or the second reference power range based on the result of the comparison.

A battery management device according to the present disclosure may comprise the precharge resistor protection apparatus of any of the embodiments described herein.

A battery pack according to the present disclosure may comprise the precharge resistor protection apparatus of any of the embodiments described herein.

Advantageous Effects

According to the present disclosure, it is possible to protect a precharge resistor when a power over an allowable power level is supplied to the precharge resistor by comparing a reference power according to a first power estimated as being supplied to the precharge resistor with a second power actually supplied to the precharge resistor and controlling the operation state of the precharge relay based on the comparison result.

In addition, the present disclosure may have various other effects, and these other effects of the present disclosure can be understood by the following description and more clearly understood by the embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

Figure 1:
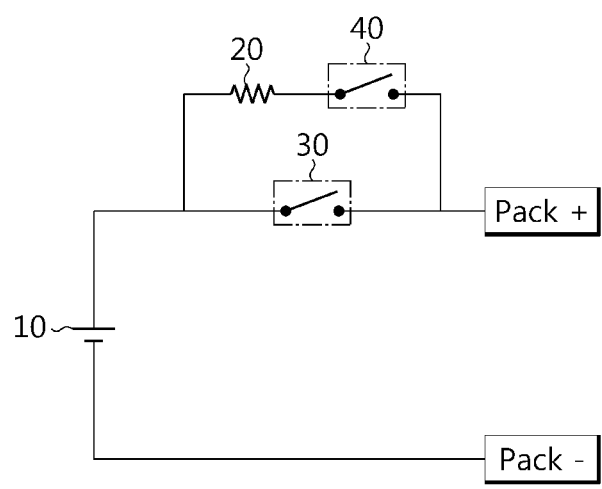
FIG. 1 is a diagram schematically showing a conventional battery pack including a precharge circuit unit.
Figure 2:
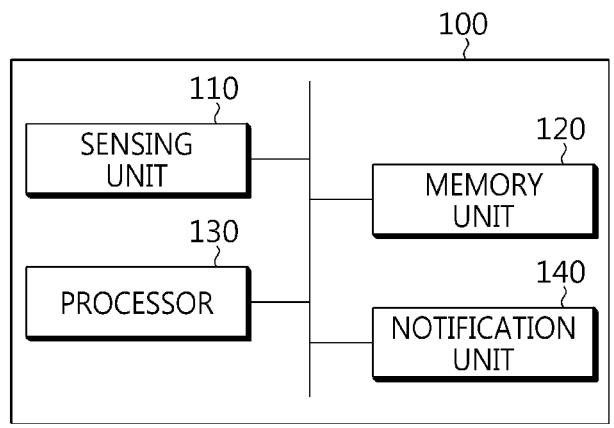
FIG. 2 is a block diagram schematically showing a precharge resistor protection apparatus according to an embodiment of the present disclosure.
Figure 3:
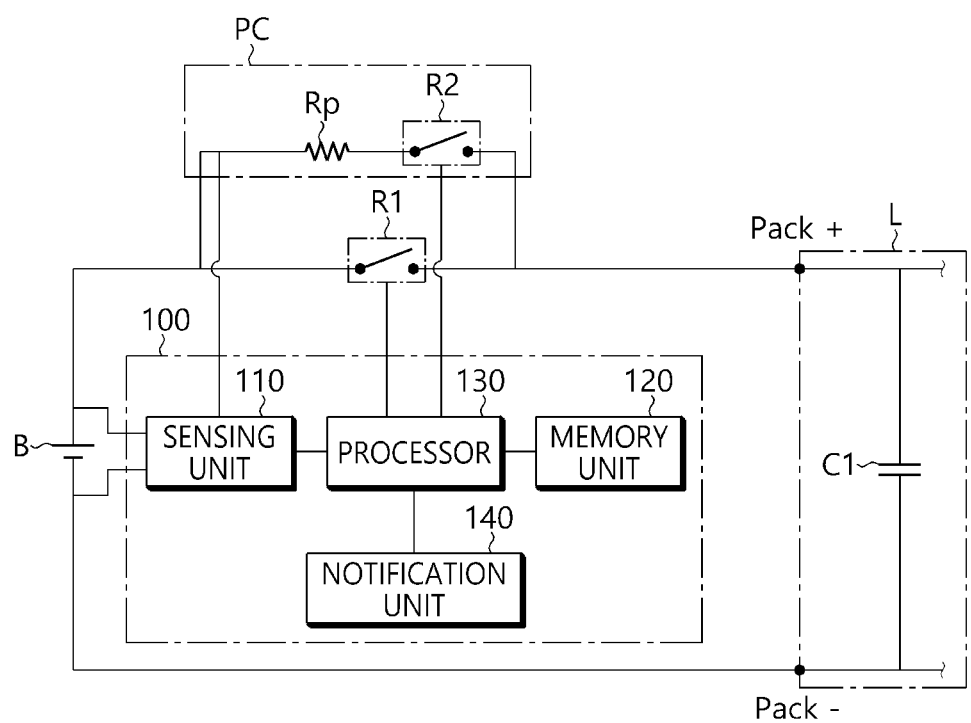
FIG. 3 is a diagram schematically showing a connection configuration among the precharge resistor protection apparatus according to an embodiment of the present disclosure, a battery pack and a load.

FIG. 2 is a block diagram schematically showing a precharge resistor protection apparatus 100 according to an embodiment of the present disclosure, and FIG. 3 is a diagram schematically showing a connection configuration among the precharge resistor protection apparatus 100 according to an embodiment of the present disclosure, a battery pack and a load L.

Referring to FIGS. 2 and 3, the precharge resistor protection apparatus 100 according to an embodiment of the present disclosure may protect a precharge resistor Rp provided in a precharge circuit unit PC that is included in a battery pack.

The battery pack including the precharge resistor protection apparatus 100 according to an embodiment of the present disclosure may have a main relay R1 provided to a charge and discharge path and a precharge circuit unit PC connected in parallel to the main relay RE The precharge circuit unit PC may have a precharge resistor Rp and a precharge relay R2 connected in series to each other. Also, the battery pack may include one or more battery cells, and the plurality of battery cells may be connected in series and/or in parallel. In the present disclosure, the plurality of battery cells will be modeled as one equivalent battery cell B.

Meanwhile, a load L may be connected to both ends of the battery pack, namely to an output terminal, and the load L may have a capacitor C1 connected in parallel to the output terminal. That is, both ends of the capacitor C1 may be connected to both ends of the battery pack.

The capacitor C1 may refer to an element having a capacitance and satisfying Equation 1 below.

$$I = C\, dv/dt \qquad \text{<Equation 1>}$$

where C is a capacitance of the capacitor, I is a current flowing in the capacitor, V is a voltage at both ends of the capacitor, and t is time.

In addition, the capacitor C1 may be implemented not only as a single capacitor but also as a combination of a plurality of capacitors, and may also be implemented as a combination of passive elements and active elements different from each other. In addition, the capacitance C of the capacitor C1 is not limited and may have an optimal value selected in consideration of the voltage at both ends of the battery pack. Meanwhile, it is preferable that the capacitance C of the capacitor C1 is known in advance or is easily measured.

Referring to FIGS. 2 and 3 again, the precharge resistor protection apparatus 100 according to an embodiment of the present disclosure may include a sensing unit 110, a memory unit 120, a processor 130, and a notification unit 140.

The sensing unit 110 is operably coupled to the processor 130. That is, the sensing unit 110 may be connected to the processor 130 to transmit an electrical signal to the processor 130 or to receive an electrical signal from the processor 130.

The sensing unit 110 may measure data that is used for the processor 130 to estimate a first power and calculate a second power, explained later.

To this end, the sensing unit 110 may repeatedly measure a battery voltage applied to both ends of the battery cell B and a precharge current flowing in the precharge resistor Rp at predetermined intervals and provide a measurement signal indicating the measured battery voltage and precharge current to the processor 130.

The sensing unit 110 may include a voltage sensor configured to measure a battery voltage applied to both ends of the battery cell B. Also, the sensing unit 110 further includes a current sensor configured to measure a precharge current flowing in the precharge resistor Rp.

If a measurement signal is received from the sensing unit 110, the processor 130 may determine digital values of the battery voltage and the precharge current, respectively, through signal processing and then store the digital values in the memory unit 120.

The memory unit 120 is a semiconductor memory device that records, erases and updates data generated by the processor 130, and stores a plurality of program codes prepared for protecting the precharge resistor Rp. In addition, the memory unit 120 may store preset values of various predetermined parameters used in implementing the present disclosure.

The memory unit 120 may is not particularly limited as long as it is a semiconductor memory element known in the art as being capable of recording, erasing and updating data. For example, the memory unit 120 may be dynamic random access memory (DRAM), synchronous DRAM (SDRAM), a flash memory, read-only memory (ROM), electrically-erasable programmable read-only memory (EEPROM), a register, and the like. In addition, the memory unit 120 may further include a storage medium that stores program codes defining the control logics of the processor 130. The storage medium includes a non-volatile storage element such as a flash memory or a hard disk. The memory unit 120 may be physically separate from the processor 130 or may be integrated with the processor 130.

The processor 130 may estimate the first power estimated as being supplied to the precharge resistor Rp during a driving time of a precharge circuit unit PC by using the capacitance of the capacitor C1 connected to both ends of the battery pack and the battery voltage.

In order to drive the precharge circuit unit PC, the processor 130 may control the operation state of the main relay R1 into a turn-off state and control the operation state of the precharge relay R2 into a turn-on state. Accordingly, the voltage of the battery cell B may be applied to the capacitor C1 of the load L via the precharge circuit unit PC. In addition, the current may flow through the precharge circuit unit PC. That is, the current may also flow through the precharge resistor Rp provided in the precharge circuit unit PC.

After that, in order to terminate the operation of the precharge circuit unit PC, the processor 130 may control the operation state of the precharge relay R2 into a turn-off state. Accordingly, the voltage of the battery cell B may not be applied to the precharge circuit unit PC and the capacitor C1 of the load L. Also, the current may not flow in the precharge circuit unit PC. That is, the current may not also flow through the precharge resistor Rp provided in the precharge circuit unit PC.

At this time, the processor 130 may calculate the driving time as a time difference between a first time point at which a turn-on control signal for controlling the operation state of the precharge relay R2 into a turn-on state is output and a second time point at which a turn-off control signal for controlling the operation state of the precharge relay R2 into a turn-off state is output. At this time, the first time point and the second time point may be a start point and an end point of the driving time of the precharge circuit unit PC, respectively.

That is, the processor 130 may calculate the time during which the current flows through the precharge resistor Rp as the driving time.

In this way, the processor 130 may estimate the first power estimated as being supplied to the precharge resistor Rp during the driving time of the precharge circuit unit PC by using the capacitance of the capacitor C1 connected to both ends of the battery pack and the battery voltage.

The first power may be a power estimated in a state where the capacitor C1 of the load L is normally connected to both ends of the battery pack and a short circuit failure or an open failure does not occur in the circuit connected to the precharge circuit unit PC and the capacitor C1 of the load L.

At this time, the processor 130 may calculate the first power by using Equation 2 below.

$$W1 = \int_{T1}^{T2} Vb(T1) \times \left(\left(\frac{Vb(T1)}{R}\right) \times e^{-\left(\frac{t}{RC}\right)}\right) dt \qquad \langle\text{Equation 2}\rangle$$

where W1 is the first power, T1 is a start point of the driving time, T2 is an end point of the driving time, Vb(T1) is the battery voltage measured at the start point of the driving time, R is a resistance of the precharge resistor, and C is a capacitance of the capacitor.

More specifically, if the operation state of the precharge relay R2 is controlled into a turn-on state and the operation state of the main relay R1 is controlled into a turn-off state, it is possible to form an RC circuit that has the precharge resistor Rp and the capacitor C1 and uses the battery cell B as a voltage source.

By using this, the processor 130 may calculate and estimate the first power by multiplying the battery voltage by the calculated value of the current calculation equation for the capacitor C1 corresponding to the RC circuit during the driving time of the precharge circuit unit PC.

After that, the processor 130 may set a first reference power range and a second reference power range by using the calculated first power. Here, the second reference power range may be set lower than the first reference power range.

More specifically, the processor 130 may set the first reference power range to be more than double of the calculated first power. In addition, the processor 130 may set the second reference power range to be less than half of the calculated first power.

After that, the processor 130 may calculate the second power supplied to the precharge resistor Rp during the driving time of the precharge circuit unit PC by using the precharge current and the battery voltage. Here, the second power may refer a power actually supplied to the precharge resistor Rp during the driving time of the precharge circuit unit PC.

At this time, the processor 130 may calculate the second power by using Equation 3 below.

$$W2 = \int_{T1}^{T2} Vb(t) \times Ir(t) dt \qquad \langle\text{Equation 3}\rangle$$

where W2 is the second power, T1 is a start point of the driving time, T2 is an end point of the driving time, Vb(t) is the battery voltage, and Ir(t) is the precharge current.

Hereinafter, the process in which the processor 130 compares the second power with the reference power range (the first reference power range and the second reference power range) will be described.

Figure 4:
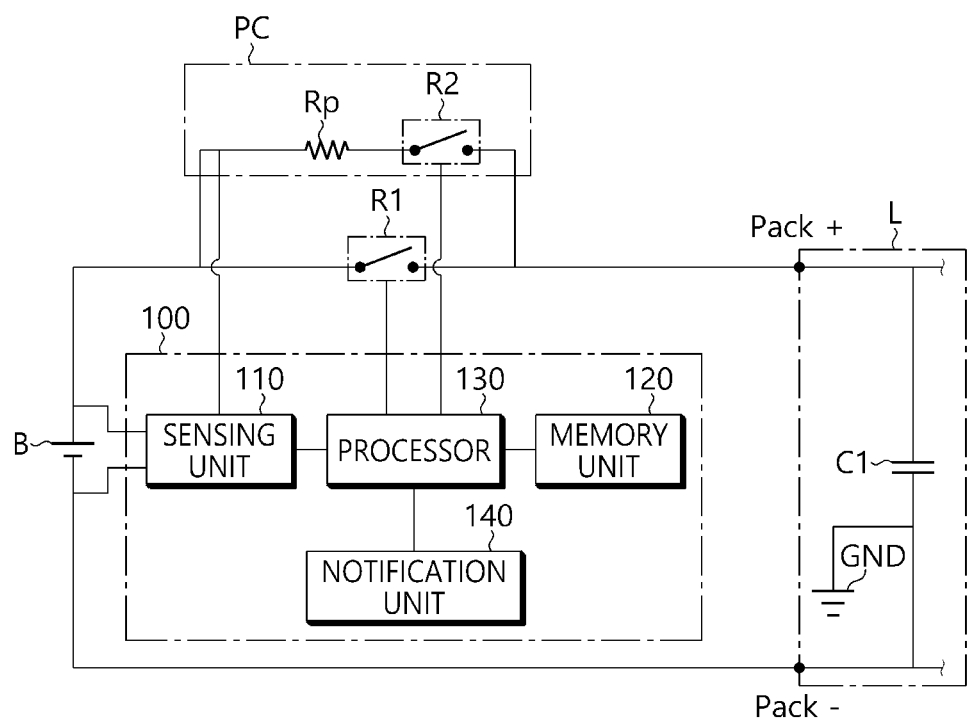
FIG. 4 is a diagram for illustrating a process in which the precharge resistor protection apparatus according to an embodiment of the present disclosure diagnoses whether a circuit connected to a capacitor is shorted.

FIG. 4 is a diagram for illustrating a process in which the precharge resistor protection apparatus 100 according to an embodiment of the present disclosure diagnoses whether a circuit connected to the capacitor C1 is shorted.

Referring to FIG. 4, the processor 130 may diagnose that the circuit connected to the capacitor C1 is shorted, if the estimated second power is included in the first reference power range. More specifically, as shown in FIG. 4, if the circuit connected to the capacitor C1 is shorted to the ground GND, the power over an allowed power level may be supplied to the precharge resistor Rp.

Accordingly, the second power, which is the power actually supplied to the precharge resistor Rp, may be included in the first reference power range that is set to more than double of the first power.

By using this, the processor 130 may diagnose that the circuit connected to the capacitor C1 is shorted, if the estimated second power is included in the first reference power range.

After that, the processor 130 may control the operation state of the precharge relay R2 into a turn-off state, if the estimated second power is included in the first reference power range. By doing so, the processor 130 allows the precharge resistor Rp not to be supplied with power any more, thereby preventing the precharge resistor Rp from being damaged.

In another embodiment, the processor 130 may control the operation state of the main relay R1 into a turn-off state, if the estimated second power is included in the first reference power range. By doing so, the processor 130 may allow the battery cell B not to be shorted to the ground GND, thereby preventing the battery cell B from being discharged as the voltage of the battery cell B is applied to the ground GND.

Figure 5:
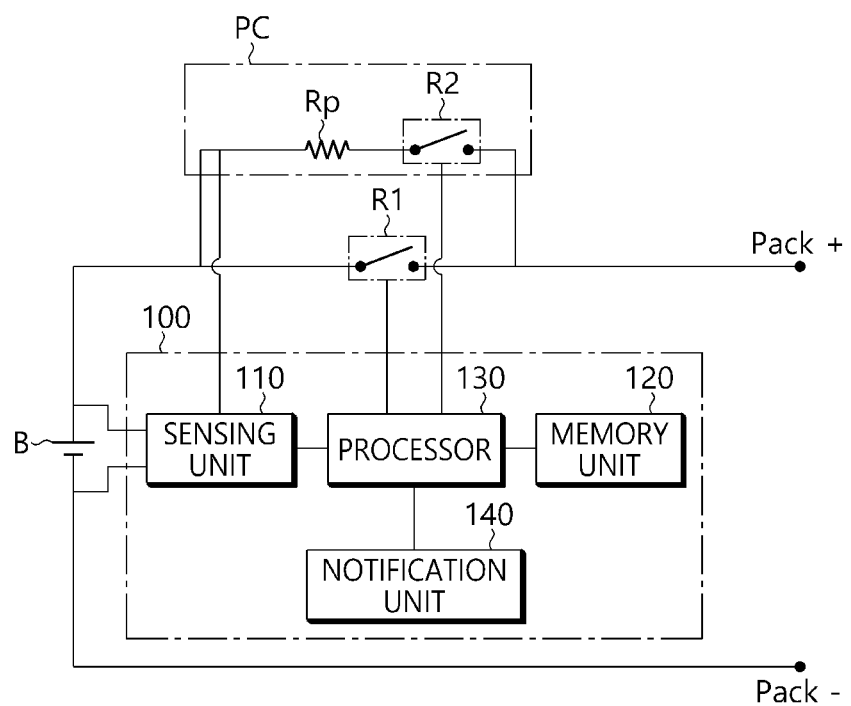
FIG. 5 is a diagram for illustrating a process in which the precharge resistor protection apparatus according to an embodiment of the present disclosure diagnoses whether both ends of the battery pack are opened.

FIG. 5 is a diagram for illustrating a process in which the precharge resistor protection apparatus 100 according to an embodiment of the present disclosure diagnoses whether both ends of the battery pack are opened.

Referring to FIG. 5 further, the processor 130 may diagnose that both ends of the battery pack are opened, if the estimated second power is included in the second reference power range. More specifically, as shown in FIG. 5, if the capacitor C1 of the load L is not connected to both ends of the battery pack, both ends of the battery pack may be opened so that the current may not flow through the precharge resistor Rp.

Accordingly, the second power, which is a power actually supplied to the precharge resistor Rp, may be included in the second reference power range that is set to be less than half of the first power.

By using this, the processor 130 may diagnose that both ends of the battery pack are opened, if the estimated second power is included in the second reference power range.

After that, the processor 130 may control the operation state of the precharge relay R2 and the main relay R1 into a turn-off state, if the estimated second power is included in the second reference power range. By doing so, the processor 130 may prevent a worker or a user from being electrically shocked as the current of the battery pack is leaked to both open ends of the battery pack.

Meanwhile, the processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

Meanwhile, the notification unit 140 may receive the diagnosis result of the processor 130 from the processor 130 or output the diagnosis result of the processor 130 stored in the memory unit 120 to the outside.

More specifically, the notification unit 140 may include at least one of a display unit for displaying the diagnosis result of the processor 130 by using at least one of symbols, numbers and codes, and a speaker unit for outputting the diagnosis result of the processor 130 with a sound.

Hereinafter, a precharge resistor protection apparatus 100' according to another embodiment of the present disclosure will be described.

Figure 6:
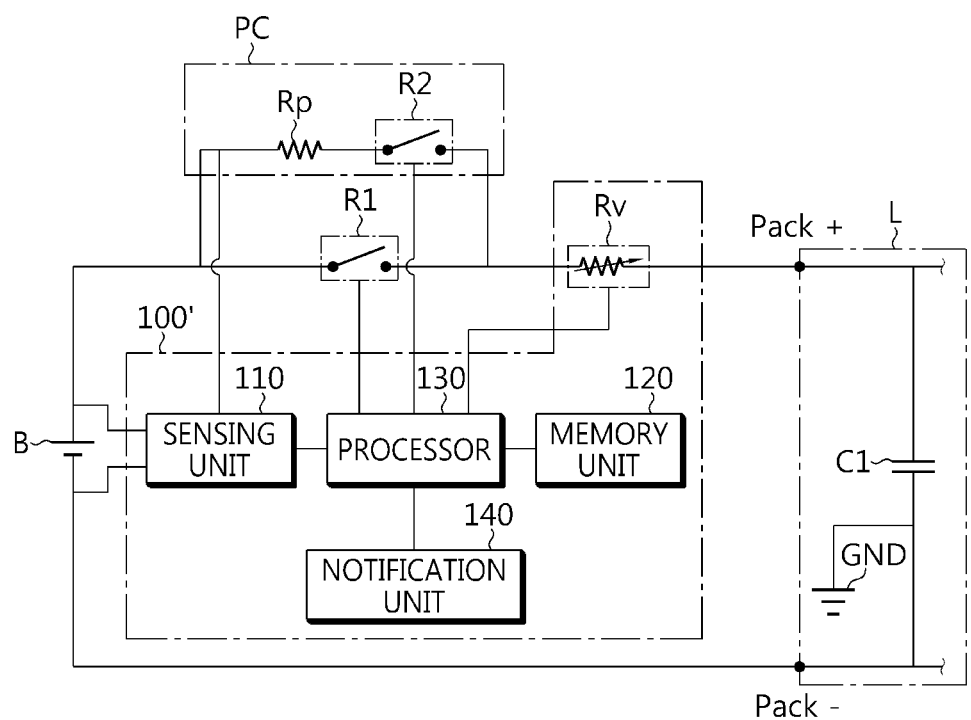
FIG. 6 is a diagram schematically showing a connection configuration among the precharge resistor protection apparatus according to another embodiment of the present disclosure, the battery pack and the load.

FIG. 6 is a diagram schematically showing a connection configuration among the precharge resistor protection apparatus 100' according to another embodiment of the present disclosure, the battery pack and the load L.

Referring to FIG. 6 further, the precharge resistor protection apparatus 100' according to another embodiment of the present disclosure is substantially identical to the precharge resistor protection apparatus 100 of the former embodiment, except that a variable resistor Rv is further provided to the charge and discharge path of the battery pack. Thus, repeated description will be omitted.

The variable resistor Rv may be a resistance element whose resistance is changed under the control of the processor 130. The type of the variable resistor Rv is not limited as long as the resistance changes corresponding to the control signal of the processor 130.

The processor 130 according to another embodiment may control the variable resistor Rv to change the resistance of the variable resistor Rv into a minimum resistance before the circuit connected to the capacitor C1 is diagnosed as being shorted.

After that, the processor 130 may diagnose that the circuit connected to the capacitor C1 is shorted to the ground GND, if the second power described above is included in the first reference power range. The processor 130 may control the variable resistor Rv to increase the resistance of the variable resistor Rv, if the circuit connected to the capacitor C1 is diagnosed as being shorted to the ground GND. At this time, the processor 130 may control the variable resistor Rv to increase the resistance of the variable resistor Rv corresponding to the battery voltage.

By doing so, if the circuit connected to the capacitor C1 is shorted to the ground GND and a non-load circuit is formed between the battery cell B and the ground GND, it is possible to prevent the battery cell B from being discharged as the battery voltage of the battery cell B is applied to the ground GND.

Meanwhile, the precharge resistor protection apparatus according to the present disclosure may be applied to a battery management device for managing a battery, such as a battery pack and an energy storage device. That is, the battery management device according to the present disclosure may include the precharge resistor protection apparatus according to the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

The features described in the individual embodiments of this specification may be implemented in combination in a single embodiment. Conversely, various features described in a single embodiment may be implemented in various embodiments individually or in a suitable sub-combination.

What is claimed is:

1. A precharge resistor protection apparatus configured to protect a precharge resistor that is connected in series to a precharge relay of a precharge circuit unit, wherein the precharge resistor apparatus is configured to be connected in parallel to a main relay provided to a charge and discharge path of a battery pack, the precharge resistor protection apparatus comprising:
    one or more sensors configured to measure a battery voltage applied to both ends of a battery cell included in the battery pack and a precharge current flowing in the precharge resistor; and
    a processor operably coupled to the one or more sensors, wherein the processor calculates is configured to:
    calculate a first power estimated as being supplied to the precharge resistor and a second power supplied to the precharge resistor during a driving time of the precharge circuit unit based on at least one of a capacitance of a capacitor connected to both ends of the battery pack, the battery voltage and the precharge current;
    compare a reference power range based on the first power with the second power; and
    control an operation state of the precharge relay based on a result of the comparison.

2. The precharge resistor protection apparatus according to claim 1,
    wherein the processor is configured to calculate the first power according to the following equation:

$$W1 = \int_{T1}^{T2} Vb(T1) \times \left(\left(\frac{Vb(T1)}{R}\right) \times e^{-\left(\frac{t}{RC}\right)}\right) dt$$

wherein W1 is the first power, T1 is a start point of the driving time, T2 is an end point of the driving time, Vb(T1) is the battery voltage measured at the start point of the driving time, R is a resistance of the precharge resistor, and C is the capacitance of the capacitor.

3. The precharge resistor protection apparatus according to claim 1,
    wherein the processor is configured to calculate the driving time as a time difference between a first time point at which a turn-on control signal for controlling the operation state of the precharge relay to a turn-on state is output and a second time point at which a turn-off control signal for controlling the operation state of the precharge relay to a turn-off state is output.

4. The precharge resistor protection apparatus according to claim 1,
    wherein the processor is configured to calculate the second power supplied to the precharge resistor during the driving time based on the precharge current and the battery voltage.

5. The precharge resistor protection apparatus according to claim 4,
    wherein the processor is configured to calculate the second power according to the following equation:

$$W2 = \int_{T1}^{T2} Vb(t) \times Ir(t) dt$$

wherein W2 is the second power, T1 is a start point of the driving time, T2 is an end point of the driving time, Vb(t) is the battery voltage, and Ir(t) is the precharge current.

6. The precharge resistor protection apparatus according to claim 4,
wherein the processor is configured to:
set a first reference power range; and
set a second reference power range lower than the first reference power range, based on the first power.

7. The precharge resistor protection apparatus according to claim 6,
wherein the processor is configured to determine that a circuit connected to the capacitor is shorted, when the second power is within the first reference power range based on the result of the comparison.

8. The precharge resistor protection apparatus according to claim 6,
wherein the processor is configured to determine that both ends of the battery pack are opened, when the second power is within the second reference power range based on the result of the comparison.

9. The precharge resistor protection apparatus according to claim 6,
wherein the processor is configured to control at least one of the operation state of the precharge relay or an operation state of the main relay to a turn-off state, when the second power is within the first reference power range or the second reference power range based on the result of the comparison.

10. A battery management device, which comprises the precharge resistor protection apparatus according to claim 1.

* * * * *